United States Patent [19]

Parmenter

[11] Patent Number: 5,068,601
[45] Date of Patent: Nov. 26, 1991

[54] DUAL FUNCTION CAM-RING SYSTEM FOR DUT BOARD PARALLEL ELECTRICAL INTER-CONNECTION AND PROBER/HANDLER DOCKING

[75] Inventor: Ronald D. Parmenter, Aloha, Oreg.

[73] Assignee: Credence Systems Corporation, Fremont, Calif.

[21] Appl. No.: 654,264

[22] Filed: Feb. 11, 1991

[51] Int. Cl.5 .............................................. G01R 31/02
[52] U.S. Cl. .................................. 324/158 F; 439/141; 439/331
[58] Field of Search ........................ 324/158 F, 158 P; 439/55, 66, 74, 140, 141, 330, 331, 482

[56] References Cited

U.S. PATENT DOCUMENTS

| | | | |
|---|---|---|---|
| 3,757,219 | 9/1973 | Aksu | 324/158 F |
| 4,225,819 | 9/1980 | Grau et al. | 324/415 |
| 4,230,985 | 10/1980 | Matrone et al. | 324/158 F |
| 4,405,191 | 9/1983 | Fetig | 324/158 F |
| 4,626,776 | 12/1986 | Wilkinson | 324/73 PC |
| 4,665,360 | 5/1987 | Phillips | 324/158 F |
| 4,667,155 | 5/1987 | Coiner et al. | 324/158 F |
| 4,782,289 | 11/1988 | Schwar et al. | 324/158 F |
| 4,843,313 | 6/1989 | Walton | 324/158 F |
| 4,857,009 | 9/1989 | Christensen | 439/372 |

Primary Examiner—Neil Abrams
Attorney, Agent, or Firm—Dellett, Smith-Hill and Bedell

[57] ABSTRACT

A dual-function DUT board connection and disconnection and prober/handler docking system is easy to use and provides high quality parallel electrical interconnection for a large number of signals by exerting a proper amount of pressure over a large but variable connection area with a high degree of reliability. A cam-ring is rotatably mounted to a load board. A DUT board, a DUT board holddown ring with cam followers and (optional) layers of pin-protecting plastic rings are aligned by two alignment pins on the load board into a correct position for mating of electrical connections between the load board and the DUT board. Rotation of the cam-ring by attached handles forces cam followers on the DUT board holddown ring to be drawn closer to the load board, bringing the DUT board into suitable electrical contact with connectors that electrically connect the DUT board to the load board. A set of secondary cams and external guide pins is provided for easy docking to suitably equipped wafer probers or device package handlers.

10 Claims, 4 Drawing Sheets

DUAL FUNCTION CAM-RING SYSTEM FOR DUT BOARD PARALLEL ELECTRICAL INTER-CONNECTION AND PROBER/HANDLER DOCKING

BACKGROUND OF THE INVENTION

This invention relates to semiconductor test systems, and more particularly to an apparatus for quick device-under-test board connection and disconnection.

Semiconductor test systems are used for testing integrated circuit (IC) devices to verify their performance characteristics. For limited volume testing, the IC device can be placed in a test fixture that is mounted on a device-under-test (DUT) board, or the DUT board can be docked with a semiconductor wafer prober or package handler for high volume production testing.

Semiconductor test systems are increasingly required to bring large numbers of high integrity digital and analog signals to bear on ever smaller and more dense device input and output pin arrangements. Mixed signal testers, in particular, are required to have a reconfigurable device-under-test interface because there is such a variety of different DUT pinouts for mixed analog and digital devices. The need to change DUT boards frequently and yet be able to make a high quality connection to a large number of signals, requires a DUT board connection and disconnection system that is easy to use and that exerts a proper amount of pressure over a large but variable connection area in a highly predictable way.

SUMMARY OF THE INVENTION

Accordingly, an object of the present invention is to provide a DUT board connection and disconnection system that is easy to use and that provides a high quality connection to a large number of signals by exerting a proper amount of pressure over a large but variable connection area with a high degree of reliability.

In accordance with the invention, there is provided a cam-ring DUT board connection system wherein the cam-ring is rotatably mounted to a load board. A DUT board, a DUT board holddown ring with cam followers and (optional) layers of pin-protecting plastic rings are aligned by two alignment pins on the load board into a correct position for mating of electrical connections between the load board and the DUT board. Rotation of the cam-ring by attached handles forces cam followers on the DUT board holddown ring to be drawn closer to the load board, bringing the DUT board into suitable electrical contact with connectors that electrically connect the DUT board to the load board. A set of secondary cams and external guide pins are provided for easy docking to suitably equipped wafer probers or device package handlers.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

DETAILED DESCRIPTION

Figure 1:
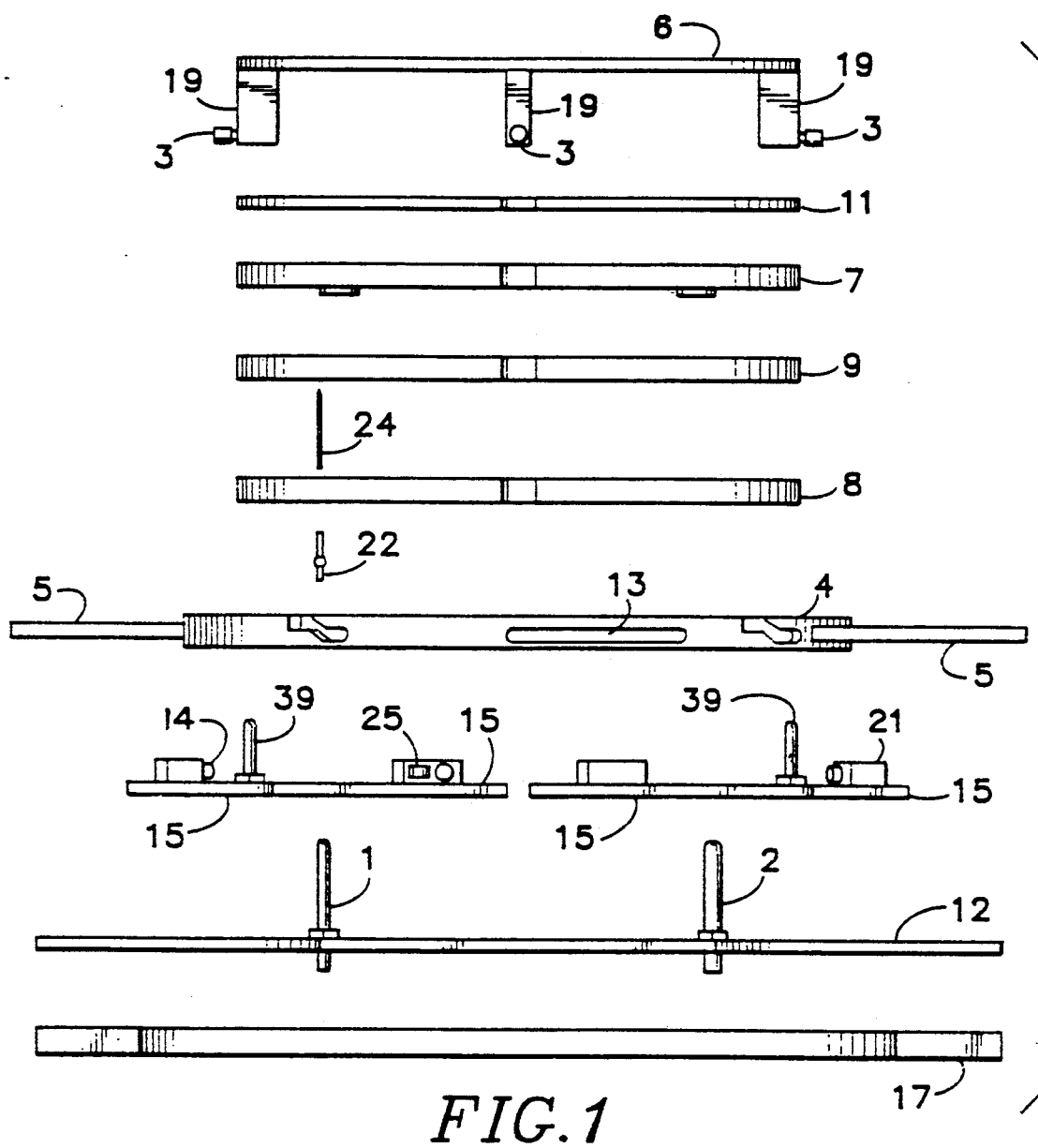
FIG. 1 is an exploded side view of the DUT board mounting system of the present invention.

The DUT board mounting system shown in FIGS. 1-5 includes a load board 12 which comprises a multi-layered circuit board having connection pads on its lower surface. The load board 12 provides a parallel electrical interface between a specialized device-under-test (DUT) board and all of the input/output circuitry of a semiconductor test system. As part of this interface and in accordance with the present invention, the load board 12 has arced concentric arrays of holes 27 (FIG. 2) and is equipped with a small guide pin 1, a large guide pin 2 and four mounts 15.

The load board 12 is mounted on a load board support member 17 which is in the shape of two concentric rings interconnected by spokes. The locations of these spokes correspond to the locations of gaps between the arced concentric arrays of holes 27 in the load board 12, thus permitting the load board support member to be made of a metal, such as aluminum, without shorting any of the electrical contacts on the load board 12.

A cam-ring 4 is mounted on the load board 12 between four mounts 15. The cam-ring 4 is provided with handles 5 and contains a set of mounting slots 13, a set of primary cams 18 and a set of secondary cams 20. Each set of slots or cams consists of four individual slots or cams symmetrically arranged around the cam-ring 4. The mounting slots 13 are used to rotatably mount the cam-ring 4 to the load board 12 by the use of four mounting slot followers 14 on the mounts 15, respectively. The mounting slots 13 are on the outside surface of the cam-ring 4 and do not create or permit any vertical travel on the part of the cam-ring 4 relative to the load board, but rather constrain it vertically while permitting rotary motion.

The degree of rotary motion that the cam-ring is permitted is limited by a pair of stop pins 16 disposed on either side of one of the mounting slots 13 at a height that causes them to interact with a mounting block 21 on the mount 15 when the maximum desired rotation has occurred. The mounting blocks 21 each support a vertical follower 25 as well as the mounting slot follower 14. The vertical followers 25 are in contact with the upper portion of the sides of the cam-ring 4 and rotate as it rotates to secure the cam-ring against horizontal movement relative to the load board 12 without impeding its free rotation. At least two of the mounts 15 are also equipped with external guide pins 39 whose function is described below.

Three layers of support rings, consisting of a first support ring 8, second support ring 9 and third support ring 7, rest on the load board 12 inside the cam ring 4 and are aligned by the small guide pin 1 and the large guide pin 2. The first and second support rings 8 and 9 are mounted on the load board 12 with screws 31 that are received by the load board support member 17. The third support ring 7 is connected to the first support ring 8 by screws 34, as will be further described below. The first, second and third support rings 8, 9 and 7, which are suitably made of plastic or other insulating material, provide protection for arrays of electrical connectors consisting of probe receptacles 22 and spring probes 24 that also form part of the parallel electrical interface and electrically connect the DUT board 11 to the connection pads of the load board 12. The lower ends of the probe receptacles 22 are soldered to the load board 12.

Each of the support rings 8, 9 and 7 has arrays of support ring holes 32 corresponding in location to the arced concentric arrays of holes 27 in the load board 12, permitting the probe receptacles 22 to fit into the arrays of holes 32 in the first support ring 8 and the spring probes to fit into the arrays of holes 32 in the second and third support rings 9 and 7.

Figure 4:
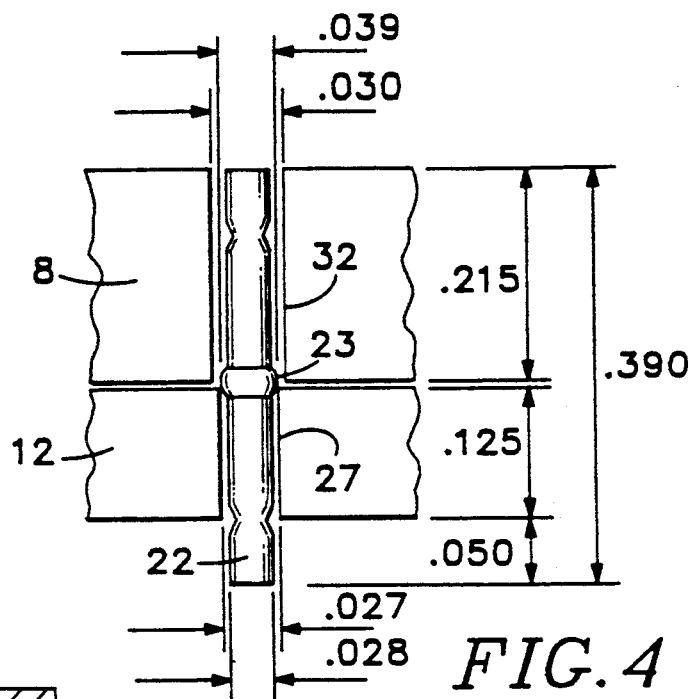
FIG. 4 illustrates the dimensions and details of a single electrical receptacle as it fits within corresponding holes in the load board and first support ring.

FIG. 4 illustrates the dimensions and details of a single probe receptacle 22 as it fits within corresponding holes in the load board 12 and first support ring 8. The holes 27 in the load board 12 are 0.028 inch (0.71 mm) in diameter and accommodate a probe receptacle 22 that is 0.027 inches (0.686 mm) in diameter. The probe receptacles 22 have a waist region 23 that has a diameter of 0.030 inches (0.762 mm). The waist region 23 brings the probe receptacle 22 to rest when it is dropped into one of the holes 27 in the load board 12. The portion of the probe receptacle 22 that is below the waist region 23 is 0.175 inches (4.44 mm) long. The multi-layer load board 12 is approximately 0.125 inches (3.18 mm) thick. Thus, approximately 0.050 inches (1.27 mm) of the probe receptacle 22 protrude below the bottom surface of the load board 12 when the waist region 23 is resting on the top surface of the load board 12. This protruding portion of the probe receptacle 22 is used for soldering to adjacent pad areas on the load board 12.

The gap shown in FIG. 4 between the load board 12 and the first support ring 8 has been shown unrealistically exaggerated for clarity; in reality there is a negligible gap between these two parts over most of their confronting surfaces. The support ring holes 32 in the first support ring 8 are 0.039 inches (0.99 mm) in diameter, and therefore large enough to easily fit over the 0.030 inch (0.762 mm) waist region 23 of the probe receptacle 2.

The first support ring 8 is approximately 0.215 inches (5.46 mm) thick, so that when the probe receptacle 22 is resting on its waist region 23 against the load board 12 and the first support ring 8 is also resting on the load board 12, the top of the probe receptacle 22 is flush with the top of the first support ring 8. This permits the upper end of a probe receptacle 22 to be held firmly in position by tape or the surface of a temporary layer while the lower end of the probe receptacle 22 is soldered to the load board 12.

Figure 3C:
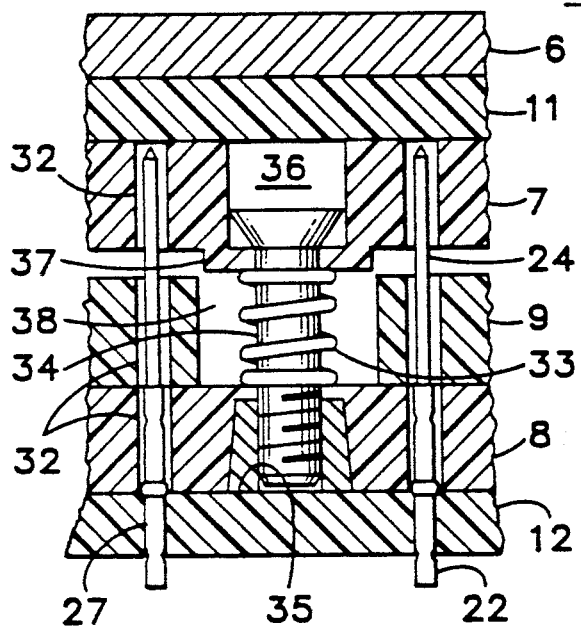
FIG. 3C is a cross-sectional view of the various parts of apparatus of the present invention as seen along 3C—3C in FIG. 2.

Referring now to FIG. 3C, the second support ring 9 protects the spring probes 24 after they have been fitted into the probe receptacles 22 and provides them a passage to the third support ring 7. The spring probes 24 in combination with the probe receptacles 22 form variable length electrical contacts that protrude from the second support ring 9.

The third support ring 7 fits over and protects the arrays of spring probes 24 in the arrays of probe receptacles 22. The third support ring 7 is connected to the first support ring 8 by four screws 34, each of which passes through a cylindrical space 38 in the second support ring 9 and mates with a metal threaded member 35 that is press fitted into the first support ring 8.

The third support ring 7 is spring biased upward by four springs 33 to a position that is sufficient to keep the spring probes 24 below the upper surface of the third support ring 7, so that the spring probes 24 are protected from damage or bending by contact with objects in the environment.

The DUT board 11, which is one of a variety of such DUT boards, has arrays of contact pads on its bottom surface corresponding in location to the arrays of holes 27 in the load board 12. The DUT board 11 is placed on the top of the third support ring 7 and aligned by the guide pins 1 and 2. A DUT board holddown ring 6 is placed on top of the DUT board 11 and is also aligned by the guide pins 1 and 2. Four rotatable primary cam followers 3 disposed below the DUT board holddown ring 6 on cam follower support arms 19 fit through openings in the top of the cam-ring 4 and thereby gain admittance to the four primary cams 18.

Figure 2:
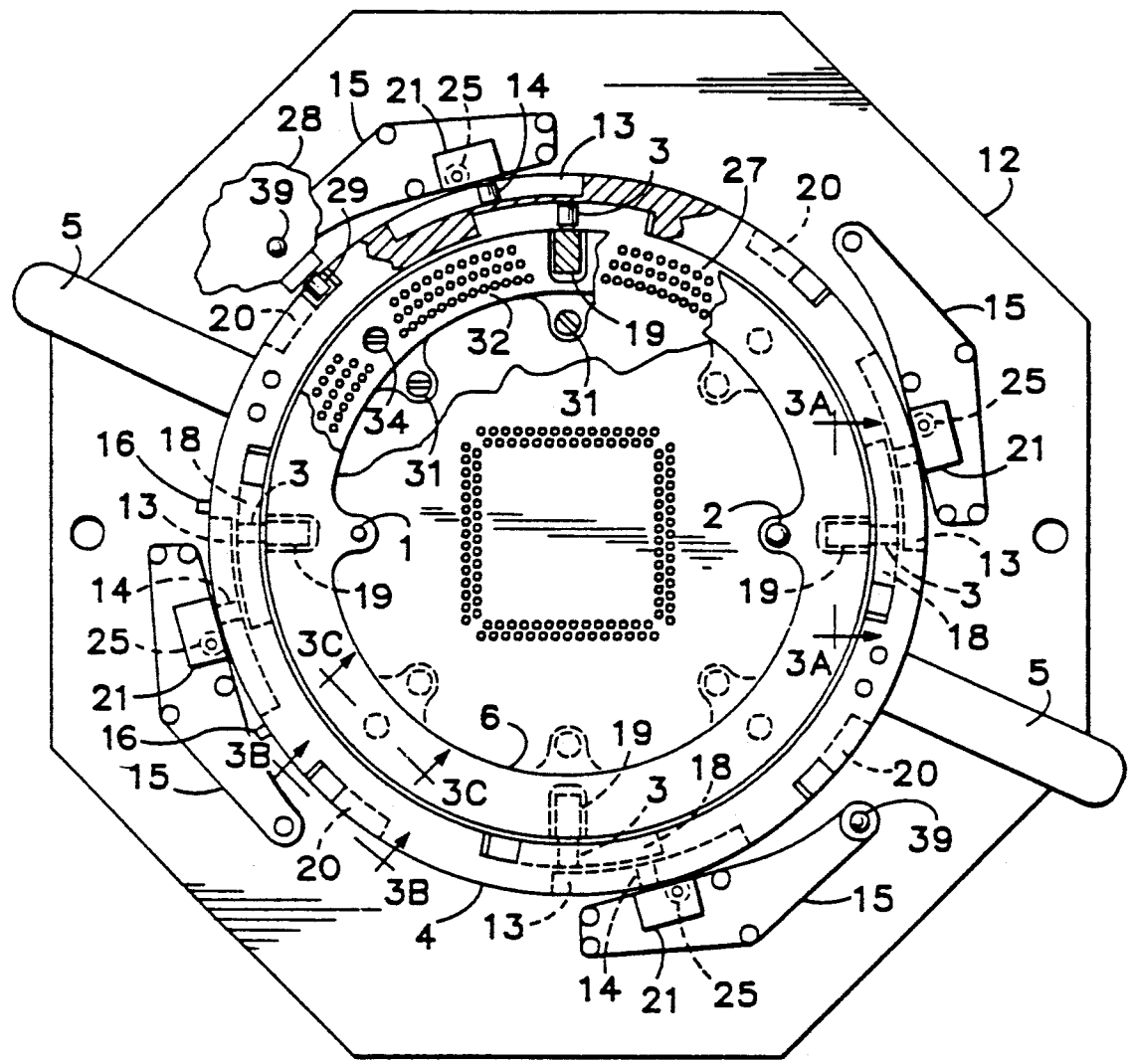
FIG. 2 is a top view (with partial cut-aways) of the DUT board mounting system according to the present invention.
Figure 3A:
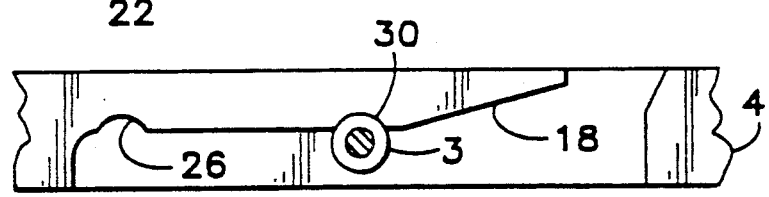
FIG. 3A is a view of the cam-ring as seen along 3A—3A in FIG. 2, particularly illustrating the primary cams.
Figure 3B:
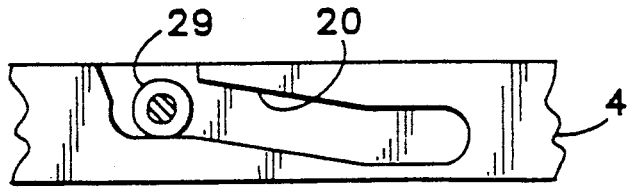
FIG. 3B is a view of the cam-ring as seen along 3B-3B in FIG. 2, particularly illustrating the secondary cams.
Figure 5:
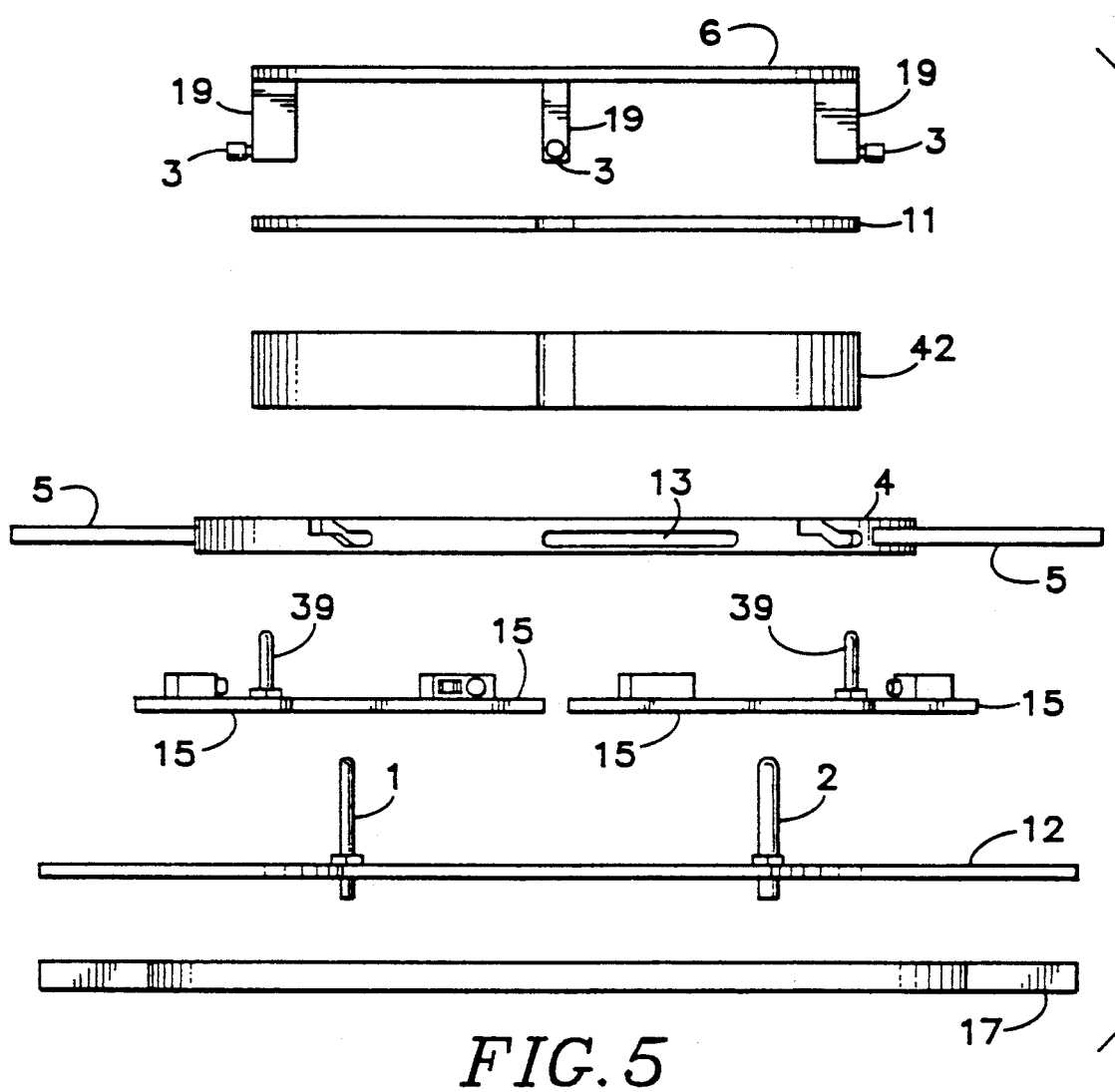
FIG. 5 is an exploded side view of an alternative embodiment of the DUT board mounting system of the present invention.

Referring now to FIGS. 3A and 3B, as well as FIG. 2, the primary cams 18 are on the inner surface of the cam-ring 4 and engage primary cam followers 3 on the DUT board holddown ring 6 (FIG. 1). Three of the cam follower support arms 19 are seen in hidden view in FIG. 2, while one of them (at the top) is seen in cross-section through a cut-away portion of the DUT board holddown ring 6, the DUT board 11 and the third support ring 7. Rotation of the cam-ring 4 through an angle of 13° from the position in which the cam followers 3 enter the primary cams 18 brings each cam follower 3 to a first detent 30 in the set of primary cams 18 and is capable of producing a total vertical downward motion of the holddown ring 6 relative to the cam-ring 4 of 0.12 inches (3.05 mm) against the force of the four springs 33 and the cumulative forces of each of the spring probes 24 in the arrays of such spring probes. While each spring probe only has a force of 1.3 ozf. (36 N.), the combined force exerted by over 500 of them is in excess of forty pounds (178 N).

In FIG. 3C, the third support ring 7, the DUT board 11 and the DUT board holddown ring 6 are shown in their elevated position, i.e., not-held-down by the operation of the primary cams 18 (FIG. 3A) against the primary cam followers 3 (handles 5 fully counter-clockwise). This position is assumed whenever the primary cam followers are released, because they are forced upwardly by the force of the four springs 33. This upward movement of the third support ring 7 is limited by contact between the head of screws 34 and the upper surface of bosses 37.

In this not-held-down position, the tips of the spring probes 24 are separated from respective pads (not shown) on the DUT board 11 by about 0.005 to 0.010 inches (0.13 to 0.25 mm), and the gap between the second support ring 9 and the third support ring 7 is about 0.110 to 0.12 inches (2.8 to 3.05 mm). As was noted above, the rotation of the cam-ring 4 to the position in which the primary cam followers 3 enter the first detents 30 produces a maximum vertical downward motion of the holddown ring 6 of about 0.120 inches (3.05 mm), but not all of that is actually used because the primary cam followers 3 are already part way down this distance before they come into contact with the primary cams 18. Consequently, the actual downward travel of the holddown ring 6, DUT board 11 and third support ring 7 during the clamping down of the DUT board holddown ring 6 is about 0.08 inches (2.0 mm).

When the interaction of primary cam followers 3 and the primary cams 18 under the influence of the handles 5 forces the third support ring 7, the DUT board 11 and the DUT board holddown ring 6 into their held-down position, the gap between the second support ring 9 and the third support ring 7 narrows to about 0.030 to 0.040 inches (0.76 to 1.02 mm), and the boss 37 on the third support ring 7 may partially extend down into the cylindrical space 38 in the second support ring 9. The boss 37 is about 0.050 inches (1.3 mm) in vertical dimension. The depth of the cylindrical cavity 36 is about 0.16 inches (4.1 mm), while the thickness of the head of screw 34 is about 0.06 inches (1.5 mm). Therefore, there is a large clearance between the head of the screw 34 and the DUT board 11 even when the top layers are clamped down 0.08 inches (2.0 mm). This allows a safety margin for variations in many of the other parts, including different styles of probe receptacles 22 and spring probes 24, if so desired.

With the DUT board 11 and DUT board holddown ring 6 in their held-down position, excellent electrical contact is maintained between the variable length electrical contacts, comprising the probe receptacles 22 and spring probes 24, and the corresponding contacts on the DUT board 11. This makes the DUT board 11 an effective part of the semiconductor test system, and DUT board 11 is now ready to receive individual DUTs (devices-undertest) for testing by the semiconductor test system.

Referring to FIGS. 2 and 3B, the secondary cams 20 are on the outside surface of the cam-ring 4 and are for engaging prober/handler cam followers 29 on a prober/handler cam follower support arm 28 when the DUT board 11 and DUT board holddown ring 6 are in the held-down position. The prober/handler cam follower support arm 28 is aligned with DUT board 11 by the external guide pins 39. The secondary cams 20 produce 0.1 inches (2.54 mm) of vertical downward motion of the support arm 28 relative to the cam-ring 4 in response to rotation of the cam-ring 4 relative to the load board 12 through an additional 13°. The additional 13° of rotation associated with the operation of the secondary cam also moves the primary cam followers 3 to a second detent 26 in the primary cams 18. In this fashion, the DUT board 11 is docked to a wafer prober or device package handler 28, so that the production testing of wafers or devices can occur.

It should also be noted the the DUT board holddown ring 6 can be used with a wide variety of DUT boards 11 having different physical sizes. All that is required to make them compatible is that they leave unused areas for the DUT board holddown ring 6 to rest on and that they provide passages for the cam follower support arms 19 to pass through to reach the cam-ring 4.

While the cam-ring 4 has been described as having two sets of cams and a set of mounting slots, other embodiments can be envisioned that have fewer sets of slots or cams. Other mounting means would eliminate the need for the mounting slots 13. And, if no wafer prober or device package handler interface is required, the secondary cams 20 could also be eliminated.

While the parallel electrical connection interface has been described as consisting of probe receptacles 22 soldered into the load board 12, equipped with spring probes 24, and protected by the first, second and third support rings 8, 9 and 7, alternative constructions are available. For example, in an alternative embodiment shown in FIG. 5, the probe receptacles 22, spring probes 24, and first, second and third support rings 8, 9 and 7 shown in FIG. 1 are all replaced with a metal on elastomer (MOE) toroid 42. Other alternative conductive means could also be employed.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A DUT board mounting system for a semiconductor tester comprising:
   a load board having a parallel electrical connection interface and at least two guide pins;
   a cam-ring rotatably mounted on the load board, the cam-ring having a handle and a plurality of primary cams disposed around the cam-ring; and
   a DUT board holddown ring having a plurality of cam followers, so that after a DUT board and the DUT board holddown ring have been aligned by the guide pins in position atop the load board, rotation of the handle on the cam-ring causes rotation of the cam-ring producing an interaction of the plurality of cam followers with the plurality of primary cams on the cam-ring to draw the DUT board toward the load board and thereby bring a parallel electrical connection surface on the DUT board into electrical contact with the parallel electrical connection interface on the load board.

2. A DUT board mounting system according to claim 1 wherein the plurality of primary cams are equally spaced around the cam-ring.

3. A DUT board mounting system according to claim 1 wherein the parallel electrical connection interface comprises a metal on elastomer connector.

4. A DUT board mounting system according to claim 1 wherein the parallel electrical connection interface comprises:
   an electrical contact protection layer; and
   an array of variable length electrical contacts.

5. A DUT board mounting system according to claim 4 wherein the electrical contact protection layer is compressible so that when the electrical contact protection layer is compressed the array of variable length electrical contacts is presented for contact and when the compressible layer is not compressed the array of variable length electrical contacts is protected.

6. A DUT board mounting system according to claim 5 wherein the compressible electrical contact protection layer comprises:
   a first insulating layer having an array of apertures corresponding in location to the array of variable length electrical contacts;
   a second insulating layer having an array of apertures corresponding in location to the array of variable length electrical contacts; and
   mechanical biasing means disposed to hold the second insulating layer away from the first insulating layer.

7. A DUT board mounting system according to claim 1 wherein the cam-ring further comprises:
a plurality of secondary cams disposed around the cam-ring, so that further rotation of the handle can be used to dock the mounting system and DUT board to another piece of equipment having suitable cam followers.

8. A DUT board mounting system according to claim 7 wherein the other piece of equipment comprises a wafer-prober.

9. A DUT board mounting system according to claim 7 wherein the other piece of equipment comprises a package handler.

10. A DUT board mounting system according to claim 7 wherein the cam-ring further comprises a plurality of mounting slots, and the DUT board mounting system further comprises a plurality of mounts connected to the load board, each mount having a mounting slot follower in contact with one of the mounting slots.

* * * * *

UNITED STATES PATENT AND TRADEMARK OFFICE
CERTIFICATE OF CORRECTION

PATENT NO. : 5,068,601

DATED : November 26, 1991

INVENTOR(S) : Ronald D. Parmenter

It is certified that error appears in the above-identified patent and that said Letters Patent is hereby corrected as shown below:

Column 3, line 51, "receptacle 2" should read --receptacle 22--.

Signed and Sealed this

Sixteenth Day of March, 1993

*Attest:*

STEPHEN G. KUNIN

*Attesting Officer*  Acting Commissioner of Patents and Trademarks